(12) United States Patent
Nishimura et al.

(10) Patent No.: US 9,165,784 B2
(45) Date of Patent: Oct. 20, 2015

(54) SUBSTRATE PROCESSING METHOD AND STORAGE MEDIUM

(75) Inventors: Eiichi Nishimura, Kurokawa-gun (JP); Masato Kushibiki, Kurokawa-gun (JP); Fumiko Yamashita, Kurokawa-gun (JP)

(73) Assignee: TOKYO ELECTRON LIMITED (JP)

( * ) Notice: Subject to any disclaimer, the term of this patent is extended or adjusted under 35 U.S.C. 154(b) by 55 days.

(21) Appl. No.: 13/428,212

(22) Filed: Mar. 23, 2012

(65) Prior Publication Data

US 2012/0244718 A1 Sep. 27, 2012

Related U.S. Application Data

(60) Provisional application No. 61/742,663, filed on Apr. 7, 2011.

(30) Foreign Application Priority Data

Mar. 23, 2011 (JP) .................................. 2011-064496

(51) Int. Cl.
  *H01L 21/302* (2006.01)
  *H01L 21/311* (2006.01)
  *H01L 21/3065* (2006.01)

(52) U.S. Cl.
  CPC ...... *H01L 21/31116* (2013.01); *H01L 21/3065* (2013.01)

(58) Field of Classification Search
  CPC .............. H01L 21/302; H01L 21/3065; H01L 21/30655; H01L 21/31058; H01L 21/311; H01L 21/3111

USPC ......... 438/700, 706, 710, 712, 714, 723, 735, 438/717, 725, 736, 716; 216/58, 72, 80
See application file for complete search history.

(56) References Cited

U.S. PATENT DOCUMENTS

| 6,376,366 | B1 * | 4/2002 | Lin et al. ........................ 438/637 |
| 6,455,232 | B1 * | 9/2002 | Lin et al. ........................ 430/313 |
| 6,630,410 | B2 * | 10/2003 | Trapp et al. .................... 438/723 |
| 8,449,785 | B2 * | 5/2013 | Kondo ............................ 216/41 |
| 2007/0026677 | A1 * | 2/2007 | Ji et al. .......................... 438/689 |
| 2007/0049013 | A1 * | 3/2007 | Tsujimoto ..................... 438/638 |
| 2009/0035944 | A1 * | 2/2009 | Chiang et al. ................. 438/703 |

FOREIGN PATENT DOCUMENTS

| JP | 10261713 | 9/1998 |
| JP | 2005251814 | 9/2005 |
| JP | 2009-206444 | 9/2009 |
| JP | 2009206401 | 9/2009 |

* cited by examiner

*Primary Examiner* — Lan Vinh
(74) *Attorney, Agent, or Firm* — Cantor Colburn LLP

(57) ABSTRACT

Disclosed is a substrate processing method capable of preventing an etching rate from being deteriorated when a high aspect ratio hole or trench is formed on an oxide film. When a high aspect ratio hole or trench is formed on an oxide film by etching the oxide film formed on a wafer using a hard mask layer having an opening and made of silicon, the oxide film corresponding to the opening is etched using plasma generated from a processing gas containing a $C_4F_6$ gas and a methane gas. Subsequently, a reactive product generated by the etching and deposited on an inner surface of the hole of the oxide film is ashed with plasma generated from a processing gas containing an oxygen gas, and the etching and the ashing processes are repeated in sequence.

4 Claims, 4 Drawing Sheets

SUBSTRATE PROCESSING METHOD AND STORAGE MEDIUM

CROSS-REFERENCE TO RELATED APPLICATIONS

This application is based on and claims priority from Japanese Patent Application No. 2011-064496, filed on Mar. 23, 2011, with the Japanese Patent Office, the disclosure of which is incorporated herein in its entirety by reference. Also, this application claims the benefit of U.S. Provisional Application No. 61/472,663 filed on Apr. 7, 2011, with the United States Patent and Trademark Office, the disclosure of which is incorporated herein in its entirety by reference.

TECHNICAL FIELD

The present disclosure relates to a substrate processing method that performs an etching process for an oxide film using silicon masking layer, and a storage medium.

BACKGROUND

When a hole or a trench is formed with a high aspect ratio by performing a plasma etching process on an oxide film made of an oxide such as silicon dioxide, a fluorocarbon-based gas or a particle fluorocarbon-based gas which easily generates a reactive product is used (see, for example, Japanese Patent Application Laid-Open No. 2009-206444). The generated reactive product is deposited on a mask layer or an inner surface of the hole or trench, but the reactive product deposited on the mask layer suppresses etching of the mask layer and thus contributes to improving a selection ratio of the oxide film to the mask layer in etching. The reactive product deposited on the inner surface of the hole or trench, in particular, the side of the hole or trench suppresses etching of the side to prevent bowing, which is a phenomenon in which a cross-sectional shape of the hole or trench is expanded, from being generated.

However, when the high aspect ratio hole or trench is formed by the plasma etching, the duration of the plasma etching becomes longer, and as a result, the amount of the generated reactive product increases until the end of plasma etching process. When the amount of the generated reactive product increases, the amount of the reactive product deposited on the bottom of the hole or trench also increases, and as a result, etching of the hole or trench is impeded in the end of plasma etching time, thereby deteriorating an etching rate.

BRIEF SUMMARY OF THE INVENTION

The present disclosure has been made in an effort to provide a substrate processing method capable of preventing an etching rate from being deteriorated when a high aspect ratio hole or trench is formed on an oxide film, and a storage medium thereof.

An exemplary embodiment of the present disclosure provides a substrate processing method for forming a hole or a trench having a high aspect ratio, which includes: etching an oxide film formed on a wafer corresponding to an opening of a mask layer made of silicon using plasma generated from a processing gas containing a fluorocarbon gas; and ashing a reactive product generated in the etching using plasma generated from a processing gas containing an oxygen gas. The etching and the ashing are repeated in sequence.

In the etching process, the processing gas may further contain a hydrocarbon gas.

The flow rate of the hydrocarbon gas in the processing gas may be less than 20% of the flow rate of the fluorocarbon gas.

The hydrocarbon may be methane.

The duration of the etching process may be 15 to 30 seconds and the duration of the ashing process may be 3 to 5 seconds.

Another exemplary embodiment of the present disclosure provides a computer-readable storage medium storing a computer executable program that, when executed, causes a computer to control a substrate processing method for forming a hole or a trench having a high aspect ratio, the method comprising: etching the oxide film formed on a wafer corresponding to an opening of a mask layer made of silicon using plasma generated from a processing gas containing a fluorocarbon gas; and ashing a reactive product generated in the main etching with plasma generated from a processing gas containing an oxygen gas. The etching process and the ashing process are repeated in sequence.

According to exemplary embodiments of the present disclosure, since an etching process of an oxide film by plasma generated from a processing gas containing a fluorocarbon gas and an ashing process of a reactive product generated in etching the oxide film are repeated in sequence, the reactive product deposited on an inner surface of a hole or trench formed by etching the oxide film is removed by the ashing, and the hole or trench formed on the oxide film can be etched again while the reactive product is not deposited on the inner surface of the hole or trench. As a result, the etching rate can be prevented from being deteriorated when the high aspect ratio hole or trench is formed on the oxide film.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described with reference to the accompanying drawings.

Figure 1:
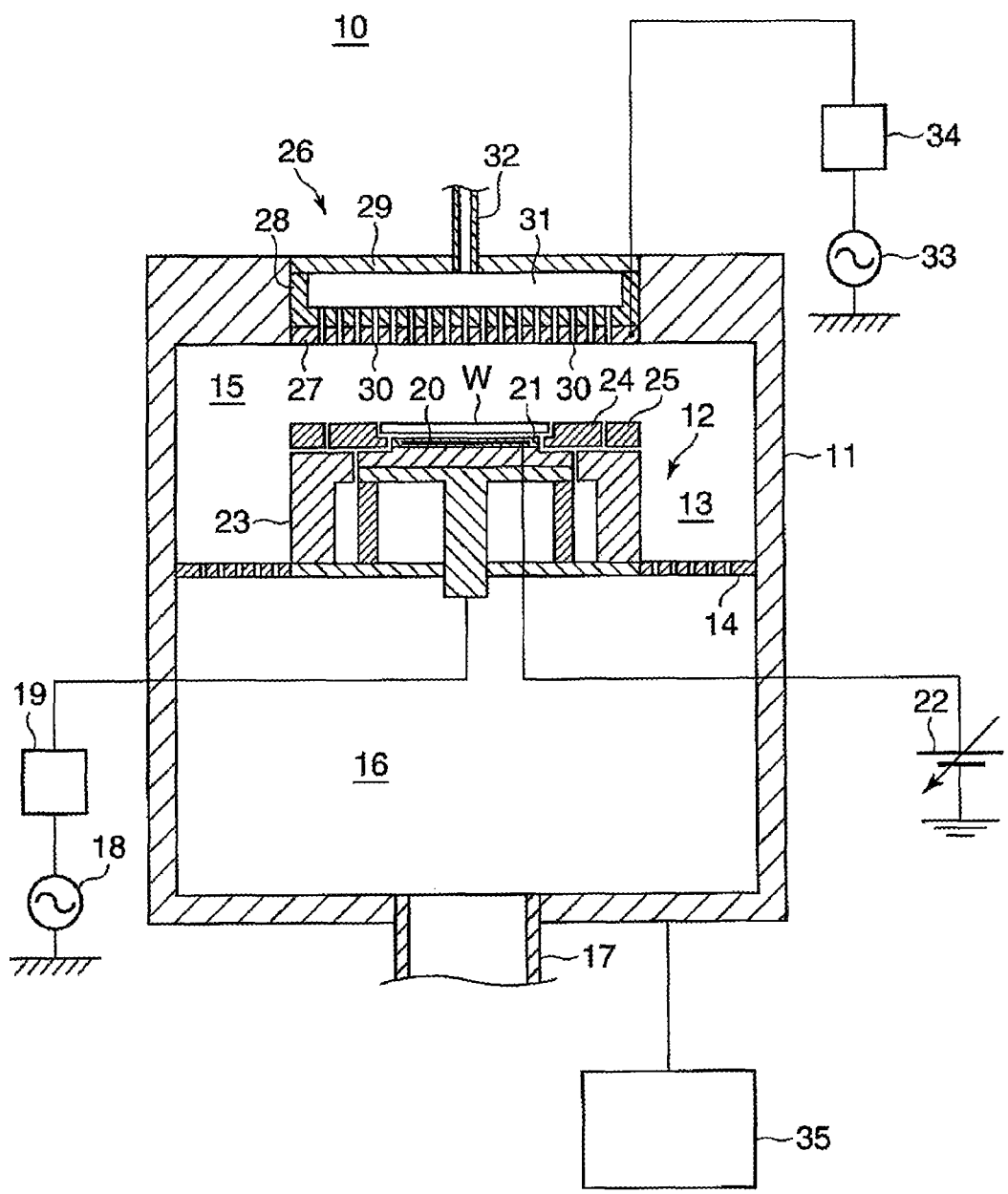
FIG. 1 is a diagram schematically illustrating a configuration of a substrate processing apparatus executing a substrate processing method according to an exemplary embodiment of the present disclosure.

FIG. 1 is a diagram schematically illustrating a configuration of a substrate processing apparatus executing a substrate processing method according to an exemplary embodiment of the present disclosure. The substrate processing apparatus performs plasma etching of a wafer for semiconductor devices (hereinafter, simply referred to as 'a wafer') serving as a substrate.

In FIG. 1, a substrate processing apparatus 10 includes, for example, a chamber 11 housing a wafer W having a diameter of 300 mm, and a cylindrical susceptor 12 on which wafer W is loaded is disposed in the chamber 11. In the substrate processing apparatus 10, a lateral exhaust passage 13 is formed by inner walls of the chamber 11 and sides of the susceptor 12. An exhaust plate 14 is disposed in the middle of the lateral exhaust passage 13.

The exhaust plate 14 is a plate shaped member having a plurality of through-holes and serves as a partition plate partitioning an inner part of the chamber 11 into an upper part and a lower part. Plasma is generated in an inner space of an upper part (hereinafter, referred to as a 'processing chamber') 15 of the inner part of the chamber 11 partitioned by the exhaust plate 14 as described below. An exhaust duct 17 that discharges a gas contained in the chamber 11 is connected to a lower part (hereinafter, referred to as an 'exhaust chamber (manifold)') 16 of the lower part of the inner part of the chamber 11. The exhaust plate 14 captures or reflects the plasma generated in the processing the chamber 15 to prevent the plasma from being leaked to the manifold 16.

A turbo molecular pump (TMP) and a dry pump (DP) (both not shown) are connected to the exhaust duct 17, and the pumps depressurize the inner part of the chamber 11 to a vacuum state. Specifically, the DP depressurizes the inner part of the chamber 11 to a medium vacuum state from an atmospheric pressure and the TMP depressurizes the inner part of the chamber 11 up to a high vacuum state which has a lower pressure than the medium vacuum state in cooperation with the DP. The pressure in the chamber 11 is controlled by an APC valve (not shown).

A first high-frequency power supply 18 is connected to the susceptor 12 in the chamber 11 through a first matching device 19 and the first high-frequency power supply 18 supplies the susceptor 12 with a high-frequency power for ion injection of, for example, 2 MHz. As a result, the susceptor 12 serves as a lower electrode. The first matching device 19 reduces reflection of the high-frequency power from the susceptor 12 to maximize efficiency of the high-frequency power supply to the susceptor 12.

A step is formed on an upper periphery of the susceptor 12 such that a center portion of the susceptor 12 protrudes upward in the figure. An electrostatic chuck 21 having an electrostatic electrode plate 20 therein, which is made of ceramic, is disposed at a front end of the center portion of the susceptor 12. A DC power supply 22 is connected to the electrostatic electrode plate 20 and when a positive DC voltage is applied to the electrostatic electrode plate 20, a negative potential is generated on a surface of wafer W (hereinafter, referred to as a 'rear surface') facing the electrostatic chuck 21 side in wafer W, such that a potential difference is generated between the electrostatic electrode plate 20 and the rear surface of wafer W. Accordingly, wafer W is adsorbed and maintained to the electrostatic chuck 21 by the Coulomb force or the Johnson-Rahbek force caused by the potential difference.

The susceptor 12 has a cooling mechanism (not shown) having a refrigerant path therein and the cooling mechanism prevents the temperature of wafer W from being increased to a desired temperature or more by absorbing heat, through the susceptor 12, of wafer W of which the temperature is increased in contact with plasma.

The susceptor 12 is made of a conductor, for example, aluminum considering heat transfer efficiency or an electrode function. However, in order to prevent the conductor from being exposed to the processing chamber 15 where plasma is generated, the side of the susceptor 12 may be covered with a side protecting member 23 made of a dielectric material, for example, quartz ($SiO_2$).

On the top of the susceptor 12, a focus ring 24 is disposed on a step of the susceptor 12 or the side protecting member 23 to surround wafer W adsorbed and maintained on the electrostatic chuck 21, and a shield ring 25 is disposed on the side protecting member 23 to surround the focus ring 24. The focus ring 24 is made of silicon (Si) or silicon carbide (SiC) and a distribution range of plasma is expanded up to the top of the focus ring 24 as well as the top of wafer W.

A shower head 26 is disposed on a ceiling of the chamber 11 to face the susceptor 12. The shower head 26 includes an upper electrode plate 27, a cooling plate 28 supporting the upper electrode plate 27 in a removably suspended state, and a cover 29 covering the cooling plate 28. The upper electrode plate 27 is formed of a disk-shaped member having a plurality of gas holes 30 penetrating in a thickness direction. A buffer chamber 31 is provided in the cooling plate 28 and a processing gas injection duct 32 is connected to the buffer chamber 31.

A second high-frequency power supply 33 is connected to the upper electrode plate 27 of the shower head 26 through a second matching device 34 and the second high-frequency power supply 33 supplies the upper electrode plate 27 with a high-frequency power for generating plasma of, for example, 40 MHz. As a result, the shower head 26 serves as an upper electrode. The second matching device 34 reduces the reflection of the high-frequency power from the upper electrode plate 27 to maximize supply efficiency of the high-frequency power to the upper electrode plate 27.

The substrate processing apparatus 10 further includes a control unit 35 which controls an operation of each constituent according to a program stored in a built-in memory to perform the plasma etching. Specifically, the control unit 35 controls the operation of each constituent to inject the processing gas supplied to the buffer chamber 31 from the processing gas injection duct 32 into the inner space of the processing chamber 15, excites the injected processing gas using the high-frequency power applied to the internal space of the processing chamber 15 from the second high-frequency power supply 33 through the upper electrode plate 27 to generate plasma, injects positive ions into the plasma toward wafer W using the high-frequency power which is applied to the susceptor 12 by the first high-frequency power supply 18, and etches wafer W using the plasma.

Figure 2:
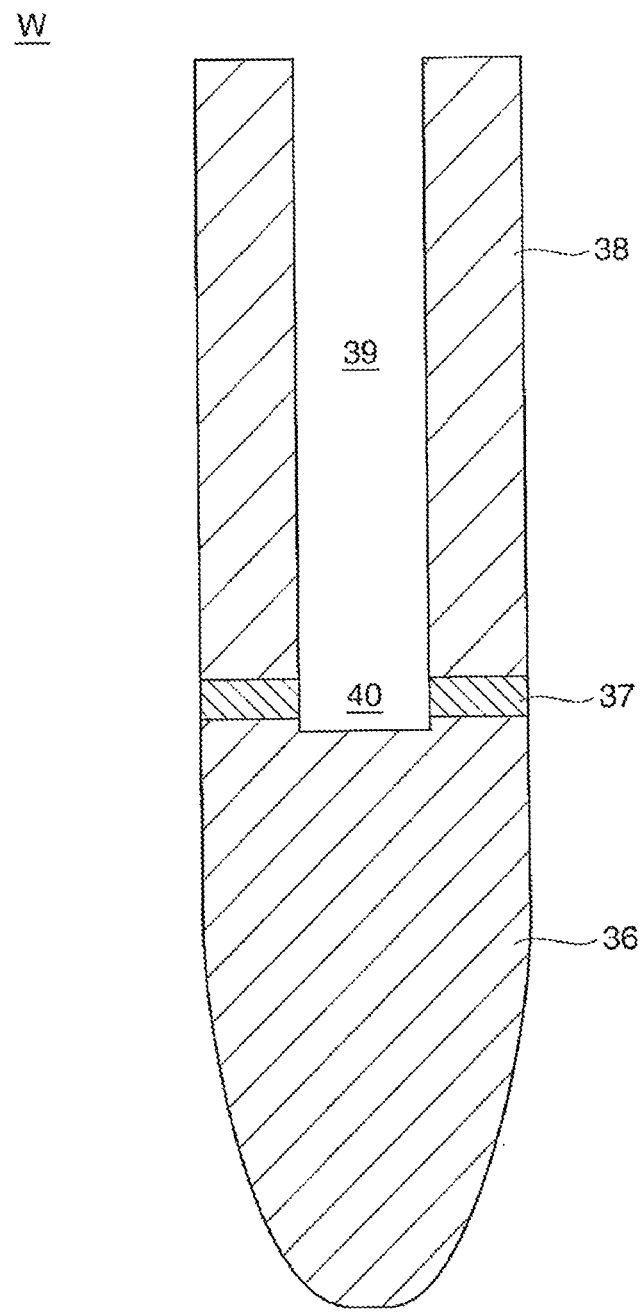
FIG. 2 is a partial cross-sectional view schematically illustrating a configuration of a wafer which is subjected to plasma etching process by the substrate processing apparatus of FIG. 1.

FIG. 2 is a partial cross-sectional view schematically illustrating a configuration of a wafer which is subjected to plasma etching process by the substrate processing apparatus of FIG. 1.

In FIG. 2, wafer W includes an oxide film 36 made of a silicon oxide, for example, silicon dioxide ($SiO_2$), a supporting silicon nitride (SiN) layer 37, and a hard mask layer 38 made of silicon, on a silicon base (not shown). In the exemplary embodiment, the hard mask layer 38 has an opening 39 formed according to a predetermined pattern, the supporting silicon nitride layer 37 also has an opening 40 corresponding to the opening 39, and the oxide film 36 is exposed to the bottom of opening 40.

The oxide film made of silicon dioxide is generally etched using plasma generated from a processing gas containing a fluorocarbon gas. However, plasma of fluorine constituting fluorocarbon, in particular, a radical of fluorine easily generates a reactive product, which is then deposited on an inner surface of a hole or trench formed on the oxide film. Meanwhile, since it is difficult to remove the reactive product using the fluorine radical, the reactive product deposited on the bottom of the hole or trench interrupts etching of the oxide film in particular to deteriorate an etching rate.

Therefore, the present inventors have intensively studied in order to solve the problems and thus have found out that the etching rate can be prevented from being deteriorated when the high aspect ratio hole or trench is formed, when an etching process by plasma generated from a processing gas containing a hydrocarbon gas as well as the fluorocarbon gas and an ashing process by plasma generated from a processing gas containing an oxygen gas are repeated in sequence. The present disclosure is based on the present finding.

Figure 3:
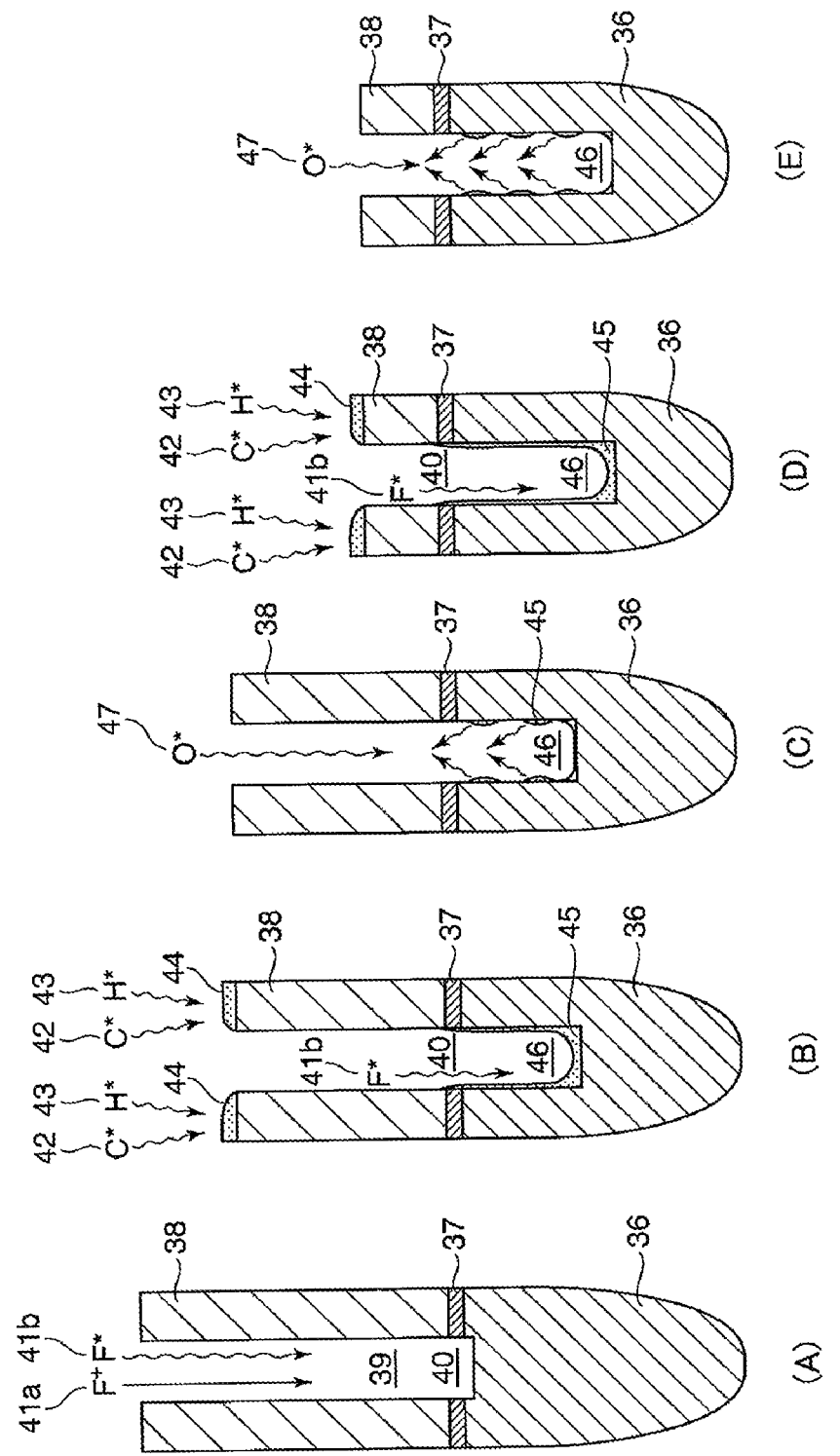
FIG. 3 is a process diagram illustrating a high aspect ratio etching process as the substrate processing method according to the exemplary embodiment.

FIG. 3 is a process diagram illustrating a high aspect ratio etching process as the substrate processing method according to the exemplary embodiment.

First, the processing gas containing the fluorocarbon gas and the hydrocarbon gas is injected into the processing chamber 15, plasma is generated from the processing gas, and the oxide film 36 exposed to the bottom of the opening 40 is etched by using the plasma. In this case, a fluorine positive ion 41a and a fluorine radical 41b are generated from the fluorocarbon gas in the processing gas, the fluorine positive ion 41a that is injected into the oxide film 36 using the high-frequency power for ion injection applied to the susceptor 12 causes the oxide film 36 to be sputtered and physically etched, and the fluorine radical 41b reacts with silicon dioxide of the oxide film 36 to chemically etch the oxide film 36 (FIG. 3A).

A carbon radical 42 or a hydrogen radical 43 is generated from the fluorocarbon gas and the hydrocarbon gas in the processing gas, and the carbon radical 42 and the hydrogen radical 43 are combined with each other to generate a hydrocarbon reactive product 44. An attachment pattern of the hydrocarbon reactive product 44 depends on the pressure in the chamber 11. However, in the exemplary embodiment, the pressure in the chamber 11 is controlled to a predetermined value, such that the reactive product 44 is actively deposited on the hard mask layer 38 without entering into the openings 39, 40 (FIG. 3B). Since the hard mask layer 38 is covered with the fluorine positive ion 41a or the fluorine radical 41b contained in the reactive product 44 that is deposited on the hard mask layer 38, etching of the hard mask layer 38 is suppressed by the fluorine positive ion 41a or the fluorine radical 41b. As a result, the reactive product 44 deposited on the hard mask layer 38 improves a selection ratio of the oxide film 36 with respect to the hard mask layer 38 in etching process.

Meanwhile, the fluorine radical 41b entering into opening 40 reacts with the carbon radical 42 to generate a fluorocarbon-based (CF-based) reactive product 45 while etching the oxide film 36. The generated reactive product 45 is deposited onto an inner surface of a hole 46 formed by etching the oxide film 36 (FIG. 3B).

Thereafter, when the reactive product 45 covers the entire inner surface of the hole 46, a processing gas containing an oxygen gas is injected into the processing chamber 15 and plasma is generated from the processing gas. In this case, an oxygen radical 47 generated from the oxygen gas in the processing gas ashes the reactive product 45 and the ashed reactive product 45 is evaporated to be removed. As a result, the oxide film 36 is exposed in the hole 46. The reactive product 44 deposited on the hard mask layer 38 is also removed by the ashing using the oxygen radical 47 (FIG. 3C).

Continuously, similar to the process of FIG. 3A, the reactive product 45 is removed from the hole 46 to expose the oxide film 36 and thereafter, the processing gas containing the fluorocarbon gas and the hydrocarbon gas is injected into the processing chamber 15 again and the oxide film 36 is etched using the fluorine positive ion 41a or the fluorine radical 41b generated from the processing gas. Even in this case, the reactive product 45 is generated and is deposited to the inner surface of the hole 46. The reactive product 44 is also actively deposited onto the hard mask layer 38 (FIG. 3D).

Continuously, similar to the process of FIG. 3C, the processing gas containing the oxygen gas is injected into the processing chamber 15 and the reactive product 45 is ashed to be removed by using the oxygen radical 47 generated from the processing gas (FIG. 3E).

Thereafter, in the substrate processing method according to the exemplary embodiment, the processes of FIGS. 3D and 3E are repeated until the depth of the hole 46 reaches a desired value.

Figure 4:
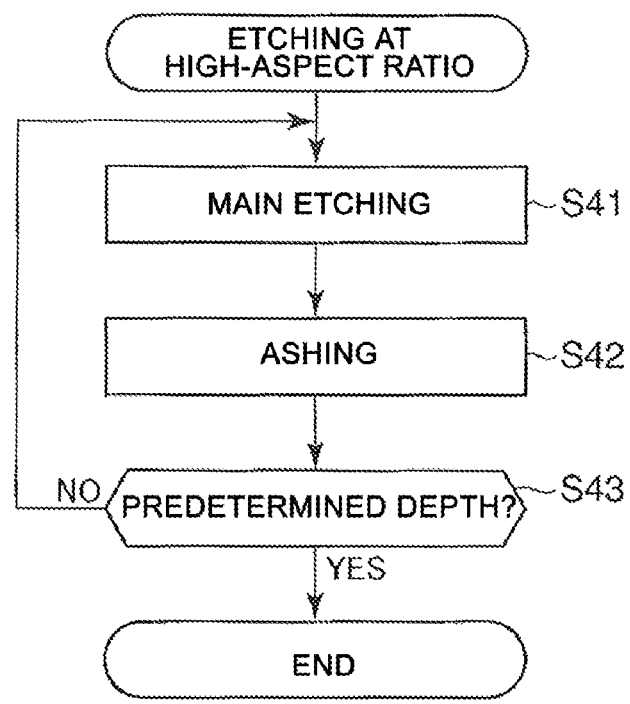
FIG. 4 is a flowchart illustrating the high aspect ratio etching process as the substrate processing method according to the exemplary embodiment.

FIG. 4 is a flowchart illustrating the high aspect ratio etching as the substrate processing method according to the exemplary embodiment.

In FIG. 4, a processing gas is first injected into processing chamber 15, which contains the fluorocarbon gas of hexafluoro-1,3-butadien ($C_4F_6$) gas, the hydrocarbon gas of methane ($CH_4$) gas, an oxygen gas ($O_2$), and an argon (Ar) gas to generate plasma from the processing gas, and a plasma etching is performed as a main etching process for 15 to 30 seconds, and preferably 20 seconds (step S41) (main etching step). As for the condition, the high-frequency power for generating plasma is supplied to the upper electrode plate 27 at 1800 W to 2200 W, preferably 2000 W, the high-frequency power for ion injection is supplied to the susceptor 12 at 3800 W to 4200 W, preferably 4000 W, the pressure in the processing chamber 15 is set to 30 mTorr to 40 mTorr, and preferably 35 mTorr.

The flow rates of the $C_4F_6$ gas, the methane gas, the oxygen gas, and the argon gas in the main etching are 60 sccm to 80 sccm and preferably 70 sccm, 5 sccm to 15 sccm and preferably 10 sccm, 60 sccm to 70 sccm and preferably 65 sccm, and 800 to 1000 sccm and preferably 900 sccm, respectively. In particular, the flow rate of the methane gas is set to less than 20% of the flow rate of the $C_4F_6$ gas.

In this case, the fluorine positive ion 41a or fluorine radical 41b generated from the processing gas etches the oxide film 36 exposed to the bottom of the opening 40 to form the hole 46 on the oxide film 36, but simultaneously, the CF-based reactive product 45 is generated to be attached on the inner surface of the hole 46 as the deposition and the reactive product 45 covers the inner surface of the hole 46.

Continuously, the processing gas containing the oxygen gas is injected into the processing chamber 15 to generate plasma from the processing gas and an ashing is performed with the plasma for 3 to 5 seconds and preferably 5 seconds (step S42). As for the condition, the high-frequency power for generating plasma is supplied to the upper electrode plate 27 at 1800 W to 2200 W and preferably 2000 W, while the high-frequency power for ion injection is set to 0 W and the pressure in processing chamber 15 is set to 30 mTorr to 40 mTorr and preferably 35 mTorr. The flow rate of the oxygen gas in the ashing is 1000 to 1100 sccm and preferably 1065 sccm.

In this case, the oxygen radical 47 generated from the processing gas ashes the reactive product 45 to be removed. As a result, the oxide film 36 is exposed from the hole 46 again.

Continuously, it is determined whether the hole 46 reaches a predetermined depth (step S43). When the hole 46 does not reach the predetermined depth, the process returns to step S41, and when the hole 46 reaches the predetermined depth, the high aspect ratio etching process ends.

As described above, according to the substrate processing method of the exemplary embodiment, an etching process of the oxide film 36 using plasma generated from the processing gas containing the $C_4F_6$ gas and an ashing process of the CF-based reactive product 45 generated in etching of the oxide film 36 are repeated in sequence. As a result, it is possible to remove the reactive product 45 formed by etching of the oxide film 36 and deposited on the inner surface of the hole 46 by ashing. It is also possible to resume the etching process of the hole 46 formed on the oxide film 36 in the state where the reactive product 45 is not deposited on the inner surface of the hole 46 due to the ashing. As a result, since the reactive product 45 does not suppress etching of the oxide film 36, the etching rate can be prevented from being deteriorated when forming the high aspect ratio hole 46.

In the substrate processing method according to the exemplary embodiment, the processing gas further includes the methane gas in the main etching. When the processing gas contains the methane gas, hydrocarbon-based reactive product 44 generated from the processing gas is actively deposited on the hard mask layer 38, other than to the hole 46. Accordingly, a selection ratio of the oxide film 36 to the hard mask layer 38 in the main etching can be improved.

In the substrate processing method according to the exemplary embodiment, the flow rate of the methane gas in the main etching is less than 20% of the flow rate of the $C_4F_6$ gas. When the flow rate of the methane gas increases, the flow rate of the $C_4F_6$ gas decreases relatively, and as a result, the amount of generated fluorine positive ion 41a or fluorine radical 41b decreases to deteriorate the etching rate of the oxide film 36, but since the flow rate of the methane gas is less than 20% of the flow rate of the $C_4F_6$ gas, the etching rate of oxide film 36 can be prevented from being deteriorated.

In the substrate processing method according to the exemplary embodiment, since the pressure in the processing chamber 15 in each of the main etching process and the ashing process is set to 30 mTorr to 40 mTorr, preferably 35 mTorr, the pressures in the processing chamber 15 in the main etching process and the ashing process may be set to the same value. As a result, the pressure in the processing chamber 15 for each process need not to be changed, such that the hole 46 can be efficiently formed. When the pressure in the processing chamber 15 increases, in particular, the structure of the hydrocarbon reactive product 44 becomes sparse, such that etching of the hard mask layer 38 by the fluorine positive ion 41a cannot be suppressed. As a result, the pressure in the processing chamber 15 is set to 100 mTorr or less, preferably 30 mTorr to 40 mTorr in the substrate processing method according to the exemplary embodiment. Accordingly, the structure of the reactive product 44 may be dense, such that etching of the hard mask layer 38 by fluorine positive ion 41a can be suppressed.

In the substrate processing method according to the exemplary embodiment, durations of the main etching and ashing processes are 15 to 30 seconds and 3 to 5 seconds, respectively. Since the structure of the reactive product 45 deposited on the inner surface of the hole 46 formed by etching of the oxide film 36 is sparse, the reactive product 45 may be easily removed by the ashing. Accordingly, even though the duration of the ashing process is set to be shorter than that of the main etching process, the reactive product 45 deposited on the inner surface of the hole 46 may be sufficiently removed. The duration of the ashing may be set to be short to shorten a total time required to form the hole 46.

The present inventors, through an experiment, found out that each of the durations of the main etching and ashing processes in the substrate processing method corresponds to the time required until the inner surface of the hole 46 is fully covered with the reactive product 45 in the main etching and a time required to remove the reactive product 45 from the hole 46 in the ashing, respectively. Accordingly, when the ratio between the duration of the main etching and the duration of the ashing is set to 15 to 30:3 to 5, etching of the oxide film 36 and removing of the reactive product 45 may be performed with a good balance and the hole 46 may be efficiently formed.

In the substrate processing method according to the exemplary embodiment, since an output value of the high-frequency power for generating plasma is set to 1800 W to 2200 W, preferably 2000 W, in each of the main etching and the ashing processes, the output values of the high-frequency power for generating plasma in the main etching and the ashing may be set to the same value. As a result, the output value of the high-frequency power for generating plasma for each process need not to be changed, such that hole 46 can be efficiently formed.

The present inventors observed shapes of a plurality of the holes 46 that are formed in a case where only the processing step S41 in the high aspect ratio etching process in FIG. 4 is continued for 160 seconds and those shapes that are formed in a case where the processing steps S41 and S42 are repeated eight times for 160 seconds in the high aspect ratio etching process of FIG. 4, and compared shapes of the holes 46 formed in the former case and those formed in the latter case with each other. The present inventors have confirmed that the depths of several holes 46 did not reach the predetermined depth in the former case, but all of the holes 46 reached the predetermined depth in the latter case. The inventors believe that even though the inner surface of the hole 46 is covered with the reactive product 45 during the main etching in the latter case, the reactive product 45 is removed by ashing and thus, the oxide film 36 is etched again while the inner surface of the hole 46 is exposed.

It was also confirmed that bowing was generated in several holes 46 in the former case, but not generated in all of the holes 46 in the latter case. The inventors believe that in the former case, the reactive product 45 is deposited in the vicinity of an inlet of the opening 39 as well as the inner surface of the hole 46 to almost block the inlet to change the shape of the inlet, such that the fluorine positive ion 41a is obliquely incident in the opening 39. In contrast, in the latter case, the reactive product 45 deposited in the vicinity of the inlet of the opening 39 is also removed by ashing, such that the fluorine positive ion 41a incident in a depth direction of the opening 39 becomes more predominant than the fluorine positive ion 41a obliquely incident in the opening 39, thereby preventing the shape of the inlet from being changed.

As described above, although the present disclosure has been described by using the exemplary embodiments, but not limited thereto. For example, although the hole 46 is formed on the oxide film 36 in the exemplary embodiment, the present disclose may be applied to a case where the trench is formed on the oxide film 36 as well.

The present disclosure may also be implemented by supplying a computer, etc. with a storage medium storing a software program implementing the functions of each of the above-described exemplary embodiments and by reading and executing the program stored in the storage medium by a CPU of the computer.

In this case, the program itself read-out from the storage medium implements the functions of the above-described exemplary embodiments, and the program and the storage medium having the program stored therein constitute the present disclosure.

Various types of storage medium may be used for supplying the program. For example, an RAM, an NV-RAM, a floppy (registered trademark) disk, a hard disk, a magneto-optical disk, an optical disk such as a CD-ROM, a CD-R, a CD-RW, DVDs (DVD-ROM, DVD-RAM, DVD-RW, and DVD+RW), a magnetic tape, a non-volatile memory card, other ROMs, that can store the program may be used. Alternatively, the program may be downloaded from a computer or database (not shown) that are connected to the Internet, commercial networks, or local area networks to be supplied to other computer.

The functions of the above-described exemplary embodiments may also be implemented not only by executing the program read by a CPU of the computer, but also by allowing an operating system (OS) running on the CPU to perform some or all of the operations corresponding to processing steps for etching and ashing processes based on the instruction of the program.

The functions of the above-described exemplary embodiments may also be implemented by allowing the CPU installed in the functional extension board or the functional extension unit to actually execute some or all of the operations corresponding to processing steps for etching and ashing processes based on the instruction of the program that is read-out from the storage medium and is recorded in a memory provided in a functional extension board inserted into the computer or in a functional extension unit connected to the computer.

The type of the above program may be an object code, a program executed by an interpreter, script data supplied to the OS, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

According to exemplary embodiments of the present disclosure, it is possible to provide a substrate processing method capable of preventing an etching rate from deteriorating when a high aspect ratio hole or trench is formed on an oxide film, and a storage medium.

What is claimed is:

1. A substrate processing method for forming a hole or a trench having a high aspect ratio comprising:
    etching an oxide film formed on a wafer corresponding to an opening of a mask layer made of silicon using plasma generated from a processing gas containing a fluorocarbon gas and a hydrocarbon gas, the etching being performed in such a way that a depth of the hole or the trench is less than a predetermined depth;
    ashing a fluorocarbon-based reactive product generated in the hole or the trench and a hydrocarbon-based reactive product generated on the mask layer during the etching using plasma generated from a processing gas containing an oxygen gas; and
    repeating the etching of the oxide film on the wafer, and the ashing of the fluorocarbon-based reactive product generated in the hole or the trench and the hydrocarbon-based reactive product generated on the mask layer sequentially for a plurality of times using the same mask layer so that the depth of the hole or the trench reaches the predetermined depth by using the same mask layer.

2. The substrate processing method of claim 1, wherein the flow rate of the hydrocarbon gas in the processing gas is less than 20% of the flow rate of fluorocarbon gas.

3. The substrate processing method of claim 1, wherein the hydrocarbon is methane.

4. The substrate processing method of claim 1, wherein a duration of the main etching process is 15 to 30 seconds and a duration of the ashing process is 3 to 5seconds.

* * * * *